(12) United States Patent
Kondo

(10) Patent No.: US 7,435,998 B2
(45) Date of Patent: Oct. 14, 2008

(54) SEMICONDUCTOR DEVICE, METHOD OF MANUFACTURING THE SAME, ELECTRO-OPTIC DEVICE AND ELECTRONIC APPARATUS WITH A PROTECTIVE FILM

(75) Inventor: Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 849 days.

(21) Appl. No.: 10/463,673

(22) Filed: Jun. 18, 2003

(65) Prior Publication Data

US 2004/0036078 A1    Feb. 26, 2004

(30) Foreign Application Priority Data

Jun. 20, 2002   (JP)   ............... 2002-180036

(51) Int. Cl.
*H01L 33/00*    (2006.01)
(52) U.S. Cl. .................. 257/98; 257/99; 257/100; 257/E33.059; 257/E33.069
(58) Field of Classification Search ............ 257/80–82, 257/83, 76, 77, 78, 79, 98–100, 626, E33.058, 257/E33.059, E33.069; 372/46.01, 50.11, 372/50.124
See application file for complete search history.

(56) References Cited

U.S. PATENT DOCUMENTS

| | | | |
|---|---|---|---|
| 5,073,230 A | 12/1991 | Maracas et al. | |
| 5,198,684 A * | 3/1993 | Sudo | ............... 257/79 |
| 5,244,818 A | 9/1993 | Jokerst et al. | |
| 5,245,622 A * | 9/1993 | Jewell et al. | ........... 372/45.01 |
| 5,280,184 A | 1/1994 | Jokerst et al. | |
| 5,286,335 A | 2/1994 | Drabik et al. | |
| 5,391,257 A | 2/1995 | Sullivan et al. | |
| 5,401,983 A * | 3/1995 | Jokerst et al. | ............. 257/82 |
| 5,465,009 A | 11/1995 | Drabik et al. | |
| 5,693,956 A * | 12/1997 | Shi et al. | ............. 257/40 |
| 5,827,751 A | 10/1998 | Nuyen | |
| 5,953,362 A * | 9/1999 | Pamulapati et al. | ......... 372/96 |
| 6,033,995 A | 3/2000 | Muller | |
| 6,126,885 A | 10/2000 | Oida et al. | |
| 6,169,756 B1 * | 1/2001 | Chirovsky et al. | ...... 372/46.015 |
| 6,214,733 B1 | 4/2001 | Sickmiller | |
| 6,262,696 B1 * | 7/2001 | Seraphim et al. | ........... 345/1.3 |
| 6,498,592 B1 * | 12/2002 | Matthies | ............. 345/1.1 |
| 6,548,912 B1 * | 4/2003 | Graff et al. | ............. 257/787 |
| 6,567,138 B1 * | 5/2003 | Krusius et al. | ............. 349/73 |
| 6,596,561 B2 * | 7/2003 | Takahashi et al. | ........... 438/113 |
| 6,661,823 B1 * | 12/2003 | Otoma et al. | ........... 372/49.01 |

FOREIGN PATENT DOCUMENTS

| | | |
|---|---|---|
| CN | 1204144 | 6/1998 |
| JP | A-62-190776 | 8/1987 |
| JP | A-3-233978 | 10/1991 |
| JP | A-4-75381 | 3/1992 |

(Continued)

*Primary Examiner*—Minh-Loan T Tran
(74) *Attorney, Agent, or Firm*—Oliff & Berridge, PLC

(57) ABSTRACT

The invention provides a semiconductor device, a method of manufacturing the same, an electro-optic device and an electronic apparatus which are capable of addressing or solving a problem of mechanical mounting of a semiconductor element chip on a substrate. A semiconductor device includes a tile-shaped microelement bonded to a substrate, and an insulating functional film provided to cover at least a portion of the tile-shaped microelement.

14 Claims, 16 Drawing Sheets

FOREIGN PATENT DOCUMENTS

| | | |
|---|---|---|
| JP | A 6-151720 | 5/1994 |
| JP | A 6-151946 | 5/1994 |
| JP | A-6-504139 | 5/1994 |
| JP | A 7-30209 | 1/1995 |
| JP | A 8-46593 | 2/1996 |
| JP | A 9-503622 | 4/1997 |
| JP | A 9-186240 | 7/1997 |
| JP | A-11-142878 | 5/1999 |
| JP | A 2000-114581 | 4/2000 |
| JP | A-2001-358370 | 12/2001 |
| JP | A-2002-353235 | 12/2002 |
| JP | A-2003-197881 | 7/2003 |
| JP | A-2003-203898 | 7/2003 |
| JP | A-2003-204047 | 7/2003 |
| JP | A-2004-14913 | 1/2004 |
| WO | WO 92/12453 | 7/1992 |

\* cited by examiner

SEMICONDUCTOR DEVICE, METHOD OF MANUFACTURING THE SAME, ELECTRO-OPTIC DEVICE AND ELECTRONIC APPARATUS WITH A PROTECTIVE FILM

BACKGROUND OF THE INVENTION

1. Field of Invention

The present invention relates to a semiconductor device, a method of manufacturing the same, an electro-optic device and an electronic apparatus.

2. Description of Related Art

In the related art, a gallium arsenide surface emitting laser (VCSEL), a photodiode (PD) or a high electron mobility transistor (HEMT) is provided on a silicon semiconductor substrate, and a micro silicon transistor is provided instead of a thin film transistor (TFT) for each pixel of a liquid crystal display (LCD). In this way, various related art techniques can be used to form a semiconductor device on a substrate including a different material.

An example of such a semiconductor device including a semiconductor composed of a different material is an optoelectronics integrated circuit (OEIC). The optoelectronics integrated circuit is an integrated circuit including an optical input/output device in which an optical signal is used to input and output a signal from and to the outside, while an electric signal is used to process a signal.

SUMMARY OF THE INVENTION

In a computer, the operational speed (operational clock) in a CPU can be increased due to the miniaturization of the internal structure of an integrated circuit. However, the signal transfer speed of a bus is reaching a limit substantially, and thus the transfer speed becomes a bottleneck of the processing speed of a computer. If signal transfer in the bus can be performed by an optical signal, the limit of the processing speed of a computer can be significantly increased. In order to realize this, a micro light-emitting element or light-receiving element must be incorporated into an integrated circuit including silicon.

However, silicon is an indirect semiconductor and thus cannot emit light. Therefore, silicon must be combined with a semiconductor light-emitting element including a material other than silicon to form an integrated circuit.

A promising related art semiconductor light-emitting element is a surface emitting laser (VCSEL) including a compound semiconductor such as gallium arsenide (GaAs) or the like. However, the surface emitting laser does not have lattice matching with silicon, and it is thus very difficult to form the surface emitting laser directly on a silicon integrated circuit by a semiconductor process, such as epitaxy or the like.

The surface emitting laser is generally formed on a gallium arsenide substrate. Therefore, in a conceivable related art method, the surface emitting laser on the gallium arsenide substrate is formed in a chip, and the chip is mechanically mounted on a silicon integrated circuit board to combine together an electric signal transfer circuit and an optical signal transfer circuit.

However, when a semiconductor light-emitting element such as a surface emitting laser chip or the like, or a semiconductor light-receiving element, such as a photodiode or the like, is mechanically mounted on a silicon semiconductor substrate, there is a problem of reliability such as the short lifetime of a semiconductor element. Therefore, it is necessary to suppress the deterioration in function of the semiconductor element in practical use.

Particularly, when the semiconductor light-emitting element or semiconductor light-receiving element is used as the semiconductor element, the optical properties of a film for covering the semiconductor element and an adhesive to bond the film to the substrate must be controlled to facilitate light emission and reception.

The present invention addresses the above and/or other considerations, and provides a semiconductor device, a method of manufacturing the same, an electro-optic device and an electronic apparatus. All of the above can be provided to address or solve the problem with mechanical mounting of a semiconductor device chip on a substrate.

In order to address or achieve the above, a semiconductor device of the present invention includes a tile-shaped microelement bonded to a substrate, and an insulating functional film provided to cover at least a portion of the tile-shaped microelement.

In the semiconductor device of the present invention, the function as an electronic device or optical device can be imparted to the tile-shaped microelement to form a device having any desired function, and the semiconductor device can be made compact (high density).

Since the insulating functional film is provided to cover at least a portion of the tile-shaped microelement, for example, the functional film is given a barrier property against oxygen and moisture to suppress the deterioration in the element function, thereby increasing the lifetime of the element. The tile-shaped microelement may include a compound semiconductor or a silicon semiconductor, and the substrate having the tile-shaped microelement bonded thereto may be a silicon semiconductor substrate or a compound semiconductor substrate.

In the semiconductor device, the functional film preferably covers the tile-shaped microelement in a sealed state.

In this case, particularly when the functional film is given the barrier property against oxygen and moisture, the deterioration of the tile-shaped microelement due to oxygen and moisture can be securely reduced or prevented.

In the semiconductor device, the tile-shaped microelement is preferably a light emitting element, such as a surface emitting laser or light emitting diode, or a light receiving element such as a photodiode or the like.

In this case, when the tile-shaped microelement is mechanically mounted on, for example, a silicon integrated circuit board, an electric signal transfer circuit and an optical signal transfer circuit can be combined together.

In the semiconductor device, the functional film is preferably transmissive to visible light and infrared light.

In this case, the functional film is provided corresponding to a light emitting section or light receiving section of the tile-shaped microelement serving as the light-emitting element or light-receiving element so that light emission from or reception by the tile-shaped microelement is not inhibited by the functional film.

In the semiconductor device, the functional film is preferably non-transmissive to visible light and infrared light.

In this case, the functional film is provided on the side opposite to the surface on which the light emitting section or light receiving section of the tile-shaped microelement serving as the light-emitting element or light-receiving element is formed, so that even when the tile-shaped microelement is thin and thus transmits light, the functional film can prevent a leakage of light transmitted through the tile-shaped microelement to the outside or reduce such leakage.

In the semiconductor device, the substrate is light-transmissive, and the tile-shaped microelement is preferably bonded to the light-transmissive substrate with an adhesive which is transmissive to visible light and infrared light.

In this case, when the light emitting section or light receiving section is provided on the substrate side of the tile-shaped microelement serving as the light-emitting element or light-receiving element, light emission from or reception by the tile-shaped microelement is not inhibited by the adhesive.

In the semiconductor device, the tile-shaped microelement is preferably bonded to the substrate with an adhesive which is non-transmissive to visible light and infrared light.

In this case, the light emitting section or light receiving section is formed on the side opposite to the substrate side of the tile-shaped microelement serving as the light-emitting element or light-receiving element so that even when the tile-shaped microelement is thin and thus transmits light, the adhesive can reduce or prevent a leakage of light transmitted through the tile-shaped microelement from the substrate side.

The semiconductor device includes a plurality of the tile-shaped microelements provided on the substrate, one of the tile-shaped microelements being preferably a device having a function different from the function of the other tile-shaped microelements.

In this case, a semiconductor device including a compact combination of a plurality of devices having different functions can be formed, although such a semiconductor device cannot be formed by using a monolithic substrate.

In the semiconductor device, the functional film preferably includes a resin film, an inorganic film, or a laminated film including these films.

In this case, a film comprising a material having a desired property according to the function of the tile-shaped microelement can be appropriately selected and used, thereby improving the function of the tile-shaped microelement.

In the semiconductor device, the functional film preferably has an antireflection function.

In this case, a fault, such as noise due to light reflection, can be reduced or prevented.

A method of manufacturing a semiconductor device of the present invention includes: forming a semiconductor element on a surface of a semiconductor substrate, separating a functional layer which is a surface layer of the semiconductor substrate and which includes the semiconductor element, to form a tile-shaped microelement, bonding the tile-shaped element to a surface of another substrate, and forming an insulating functional film to cover at least a portion of the tile-shaped microelement.

The method of manufacturing the semiconductor device is capable of forming an integrated circuit by bonding the semiconductor element which is separated in a micro tile-shaped shape to any material.

The tile-shaped microelement can be given the function as an electronic device or optical device to form a device having any desired function, and the semiconductor device can be made compact (high density).

Since the insulating functional film is provided to cover at least a portion of the tile-shaped microelement, for example, the functional film can be given the barrier property against oxygen and moisture to reduce or suppress deterioration in the element function, increasing the lifetime of the element.

Also, the semiconductor is completed on the semiconductor substrate and then separated in the micro tile-shaped shape, and thus the semiconductor element can be tested and sorted before an integrated circuit is formed.

In a further aspect of the present invention, a method of manufacturing a semiconductor device includes forming a semiconductor element on a surface of a semiconductor substrate, bonding a film to the surface of the semiconductor substrate on which the semiconductor element is formed, separating only a functional layer which is a surface layer of the semiconductor substrate and which includes the semiconductor element, to form a tile-shaped microelement, bonding the tile-shaped element to a surface of another substrate, and forming an insulating functional film to cover at least a portion of the tile-shaped microelement.

The method of manufacturing the semiconductor device is capable of separating the functional layer including the semiconductor element in a micro tile shape from the semiconductor substrate, and then mounting the semiconductor element on a film for permitting handling. Therefore, any desired semiconductor element can be selected separately and joined to a final substrate, and the size of the semiconductor element which can be handled can be decreased to a size smaller than that in a related art mounting technique.

The tile-shaped microelement can be given the function as an electronic device or optical device to form a device having any desired function, and the semiconductor device can be made compact (high density).

Since the insulating functional film is provided to cover at least a portion of the tile-shaped microelement, for example, the functional film can be given the barrier property against oxygen and moisture to reduce or suppress deterioration in the element function, increasing the lifetime of the element.

Also, the semiconductor is completed on the semiconductor substrate and then separated in the micro tile shape, and thus the semiconductor element can be tested and sorted before an integrated circuit is formed.

In the method of manufacturing the semiconductor device, the insulating functional film is preferably formed by a droplet discharge process or dispenser process.

In this case, a material for the functional film can be coated on any desired portion, and thus can be selectively provided only at any desired position of the substrate. Also, the amount of the material used for the functional film can be significantly decreased to decrease the manufacture cost.

In the method of manufacturing the semiconductor device, the semiconductor element in the tile-shaped microelement bonded to the other substrate is preferably bonded to a circuit formed on the other substrate.

In this case, the semiconductor layer in the functional layer is electrically connected to a circuit formed on the other substrate to form a semiconductor device having-multiple functions.

An electro-optic device of the present invention includes the above-described semiconductor device or a semiconductor device manufactured by the above-described manufacturing method.

The electro-optic device can be made compact (high density), and has higher reliability because it includes the semiconductor device in which deterioration in the element function is reduced or suppressed.

An electronic apparatus of the present invention includes the above-described electro-optic device.

The electronic apparatus has higher reliability because it includes the electro-optic device.

DETAILED DESCRIPTION OF PREFERRED EMBODIMENTS

A semiconductor device according to the present invention is described below with reference to the drawings.

First Exemplary Embodiment

Figure 1:
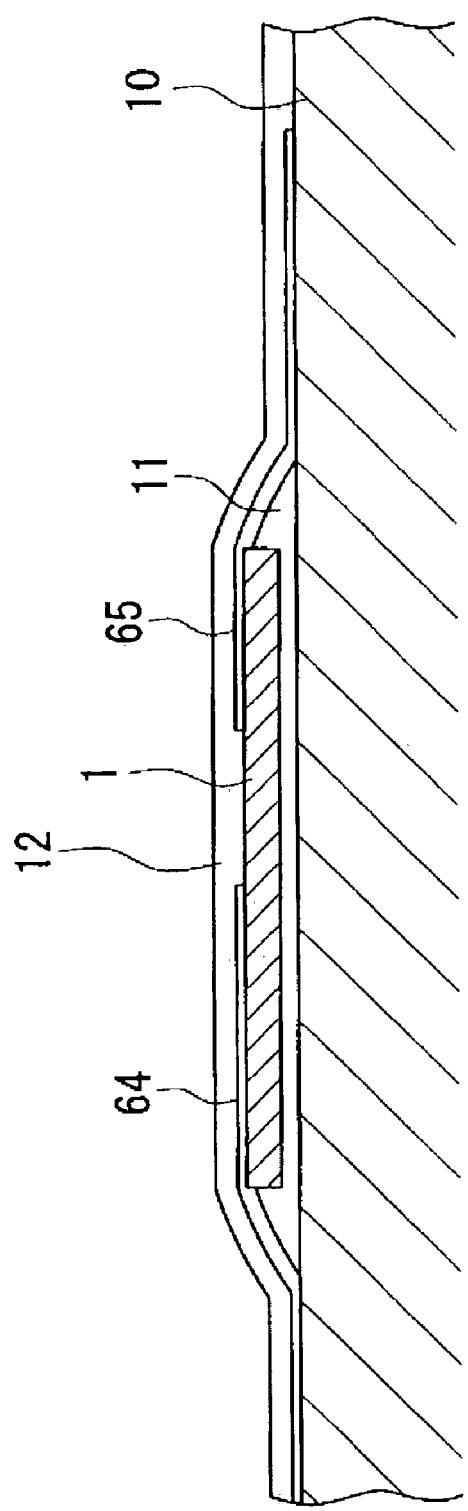
FIG. 1 is a sectional side view illustrating a significant portion of the schematic construction of a semiconductor device according to an exemplary embodiment of the present invention.

FIG. 1 is a schematic showing a semiconductor device according to a first exemplary embodiment of the present invention. The semiconductor device includes a substrate 10, a tile-shaped microelement 1, and a functional film 12 covering the tile-shaped element 1. In this exemplary embodiment, a surface emitting semiconductor laser is formed as the semiconductor device.

Figure 2:
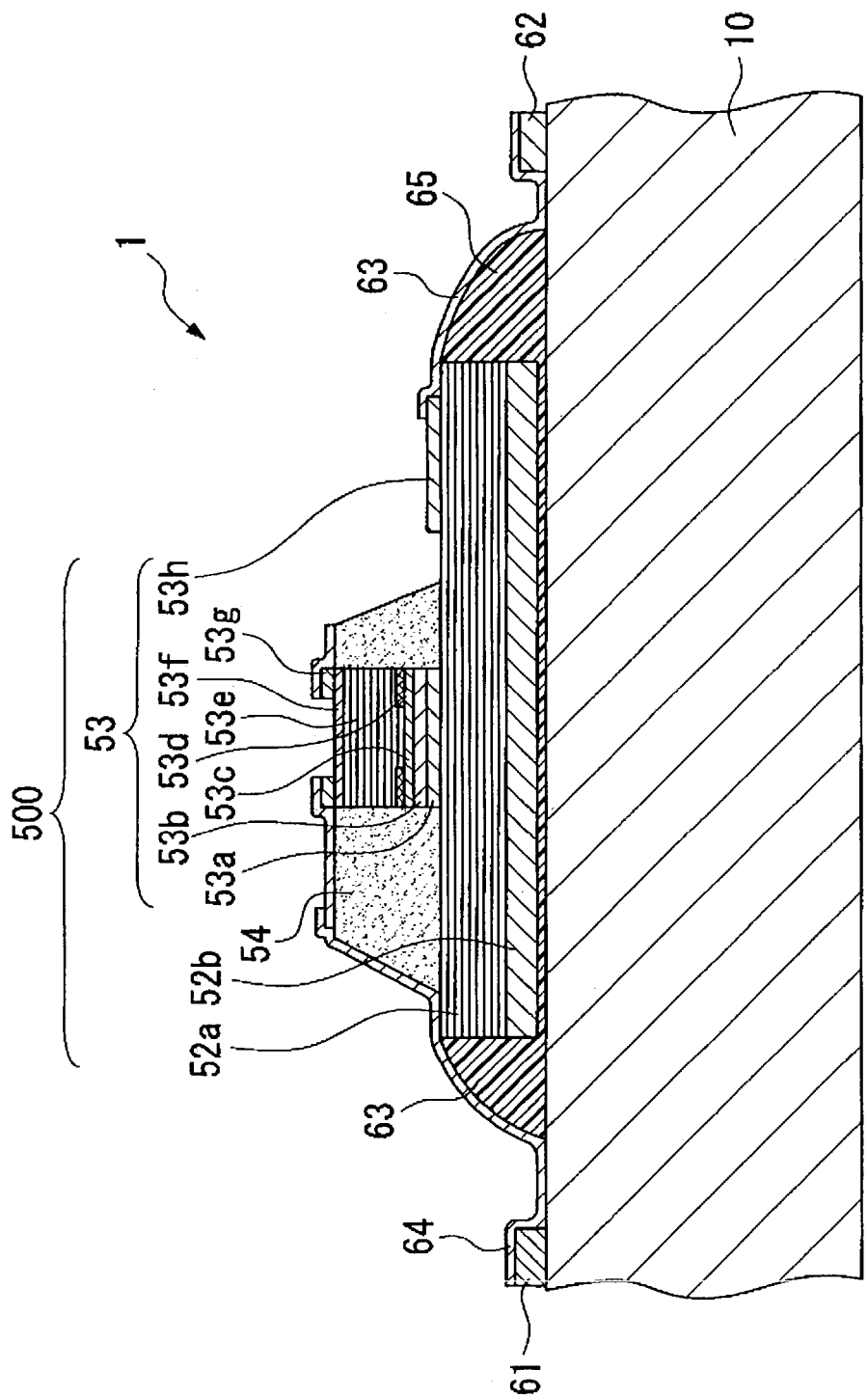
FIG. 2 is a sectional side view illustrating a significant portion of the schematic construction of a surface emitting laser formed in a tile-shaped microelement.

The tile-shaped microelement 1 has a micro tile shape (a substantially plate shape) having a semiconductor device (semiconductor element) formed therein, and includes a surface emitting laser having a structure, for example, shown in FIG. 2.

The surface emitting laser includes a highly conductive layer (high carrier concentration layer) 52b including an n-type gallium arsenide compound semiconductor layer (n-type GaAs layer) having a rectangular planar shape, a lower reflecting mirror layer structure (hereinafter "lower mirror") 52a formed over the entire upper surface of the highly conductive layer 52b, and layers 53a to 53f which are laminated on the lower mirror 52a in that order to form a cylindrical mesa. Also, an insulating layer 54 made of polyimide or the like and electrodes 53g and 53h are properly provided around the mesa. The tile-shaped microelement 1 including the surface emitting laser includes a semiconductor element 53 including the layers 53a to 53h, and the lower mirror 52a.

In the present invention, the tile-shaped microelement 1 has an element structure necessary to exhibit at least a desired function as a semiconductor element. For example, when the function as the surface emitting laser is exhibited, the tile-shaped microelement 1 has a semiconductor layer structure including at least the upper and lower mirrors 53e and 52a and the layers held between both mirror layers. However, the tile-shaped microelement 1 may include secondary components to exhibit the function, such as the contact layer 53f, the electrodes 53g and 53h, and the insulating layer 54. A portion including the tile-shaped microelement 1, the functional layer 12 and the high carrier concentration layer 52b is referred to as a "semiconductor element member 500". The mesa may have any desired shape.

The mesa includes the following structure. The n-type clad layer 53a including n-type $Al_{0.5}Ga_{0.5}As$ formed on the lower mirror 52a, and the active layer 53b and the p-type clad layer 53c including p-type $Al_{0.5}Ga_{0.5}As$ are formed on the n-type clad layer 53a. Also, the horizontal oxide layer (current aperture) 53d formed in a ring in the periphery of the mesa, and the upper reflecting mirror layer structure (hereinafter "upper mirror") 53e and the contact layer 53f including a p-type GaAs layer are further formed in that order. Furthermore, the insulating layer 54 is formed around the mesa, the p-type (cathode) electrode 53g and n-type (anode) electrode 53h are formed on the upper surfaces of the contact layer 53f and the lower mirror 52a, respectively. Therefore, when a voltage is applied between both electrodes, a laser beam is emitted from the upper end of the mesa in the axial direction thereof. The cathode electrode 53g is formed in a ring so that the laser beam is emitted from the center of the mesa.

The highly conductive layer 52b is adapted to secure a current path to decrease the electric resistance of the semiconductor element. The highly conductive layer 52b comprises a high carrier concentration layer of the same conduction type as the lower mirror 52a, and has a carrier concentration of about 5 to $10 \times 10^{18}$ $cm^{-3}$. Although the high carrier concentration layer is preferably a GaAs layer, it may be an $Al_xGa_{1-x}As$ layer (x is 0.2 or less). However, in the $Al_xGa_{1-x}As$ layer, the resistance tends to increase as x increases. The thickness of the highly conductive layer 52b is 0.3 μm or more, and preferably 1 μm or more.

The active layer 53b includes a GaAs well layer and an $Al_{0.3}Ga_{0.7}As$ barrier layer, the well layer having a multiquantum well structure (MQW) including three layers.

Each of the mirrors 52a and 53e constitutes a resonator serving as a laser reflecting mirror, and, for example, it is a distributed Bragg reflection multilayer film mirror (DBR mirror) in which two types of $Al_xGa_{1-x}As$ layers having different compositions are alternately laminated. In this exemplary embodiment, the lower mirror 52a comprises about 30 pairs of n-type $Al_{0.15}Ga_{0.85}As$ layer and n-type $Al_{0.9}Ga_{0.1}As$ layer which are alternately laminated, and the upper mirror 53e comprises about 25 pairs of p-type $Al_{0.15}Ga_{0.85}As$ layer and p-type $Al_{0.9}Ga_{0.1}As$ layer which are alternately laminated. Each of the $Al_xGa_{1-x}As$ layers has an optical thickness corresponding to ¼ of the laser emission wavelength, and a carrier concentration of about 1 to $5 \times 10^{18}$ $cm^{-3}$. The upper mirror 53e is doped with C (carbon) to be made the p-type, and the lower mirror 52a is doped with Si to be made the n-type. Therefore, the upper mirror 53e, the active layer 53b undoped with an impurity and the lower mirror 52a constitute a PIN diode. The conduction types of the lower and upper mirrors may be reversed according to the polarity of the laser. Also, a dielectric multilayer film or metal film may be formed instead of the semiconductor multilayer film.

The current aperture 53d is an insulating layer mainly including an Al oxide, and has the effect of decreasing the area of an active region to emit light to decrease the threshold current and narrow the beam width.

Figure 3:
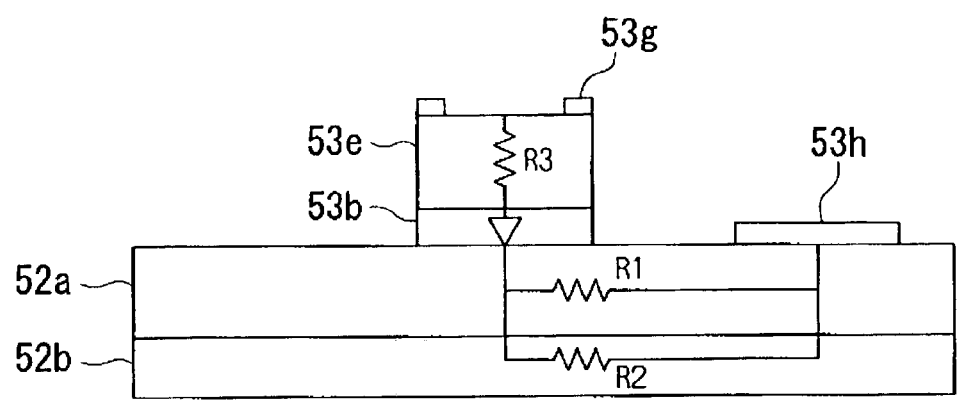
FIG. 3 is a schematic illustrating the current path in the surface emitting laser shown in FIG. 2.

The surface emitting laser having the above-described element structure has such a current path as shown in FIG. 3.

In FIG. 3, the resistance R3 of the upper mirror 53e, the resistance R1 of the lower mirror 52a and the resistance R2 of the high carrier concentration layer 53b are connected to each other to form an electric circuit between the electrodes 53g and 53h, and a current possibly flows in the circuit. The resistances R1 and R2 are connected in parallel, and thus if the resistances R1 and R2 are considered as a total resistance R, the resistances R and R3 are connected in series in the electric circuit.

In this exemplary embodiment, the resistivity of the lower mirror 52a is about $1.1 \times 10^{-2}$ $\Omega cm$ (the DBR mirror including 30 pairs of layers and having a carrier concentration of $5 \times 10^{18}$ $cm^{-3}$), and thus R1=20 $\Omega$ when the thickness is 3 μm. On the other hand, in this exemplary embodiment, the resistivity of the high carrier concentration layer is about $1.3 \times 10^{-3}$ $\Omega cm$ (the n-GaAs layer having a carrier concentration of $1 \times 10^{19}$ $cm^{-3}$), and thus R2=6.7 $\Omega$ when the thickness is 1 μm, and R2=3.35 $\Omega$ when the thickness is 2 μm. As described above, the resistances R1 and R2 are connected in parallel, and thus the total resistance R=5.0 $\Omega$ when the thickness of the high carrier concentration layer is 1 μm, and R=2.9 $\Omega$ when the thickness of the high carrier concentration layer is 2 μm. These values are ¼ to ⅙ of that of a single lower mirror without the high carrier concentration layer, and thus the electric resistance of the surface emitting laser can be decreased.

When the carrier concentration of the lower mirror 52a is increased to about $1 \times 10^{19}$ $cm^{-3}$ to impart conductivity to the lower mirror 52a, an optical absorption loss is increased to deteriorate the function (optical property) as a reflecting layer. In this exemplary embodiment, therefore, the high carrier concentration layer which has high conductivity and a high optical-absorption coefficient and which thus has the influence on the optical property is provided below (a portion apart from the light emission path of the laser beam) the lower mirror as viewed from the active layer, thereby preventing the influence of the laser on the optical property.

The position of the highly conductive layer may be appropriately set according to the influence on the properties of the semiconductor element, and the position is not limited to the above-described position. For example, the highly conductive layer may be inserted into the functional layer.

The thickness of the tile-shaped microelement 1 is, for example, about 1 μm to 10 (20) μm. The semiconductor device (semiconductor element) is formed in the tile-shaped microelement 1. Besides the surface emitting laser (VCSEL), a light emitting diode (LED), a photodiode (PD), a high electron mobility transistor (HEMT), a hetero bipolar transistor (HBT), or the like can be formed as the semiconductor device. Any one of these semiconductor devices includes a plurality of epitaxial layers laminated on a predetermined substrate. Each of the semiconductor devices further includes electrodes, and is subjected to an operation test.

The tile-shaped microelement 1 is separated in a predetermined shape from the substrate by the method described below. The size (length and width) of the tile-shaped microelement 1 is, for example, several tens μm to several hundreds μm.

The tile-shaped microelement 1 is bonded to a substrate 10 other than the substrate used to manufacture the tile-shaped microelement 1 to form a semiconductor device, such as OEIC or the like. Namely, as shown in FIGS. 1 and 2, the tile-shaped microelement 1 is bonded to the Si substrate 10 with an adhesive layer 11. Also, a cathode electrode 61 and anode electrode 62 are formed on the surface of the substrate 10 so as to be connected to a circuit (not shown in the drawings) previously formed thereon. Furthermore, the electrode 61 is connected to the electrode 53g through wiring 64 formed on the surface of an insulating layer 63, and the electrode 62 is connected to the electrode 53h through wiring 65 formed on the surface of the insulating layer 63.

As an adhesive to form the adhesive layer 11, an insulating resin is preferably used. The insulating adhesive layer 11 exhibits insulating performance together with the insulating layer 63, thereby securely preventing a short circuit in the wirings 64 and 65. In this exemplary embodiment, as described above, the surface emitting laser of the tile-shaped microelement 1 emits light to the side opposite to the substrate 10, and thus the adhesive is preferably non-transmissive to visible light and infrared light. In this case, even when the tile-shaped microelement 1 is thin and thus likely to transmit light to the side opposite to the emission side, the adhesive can prevent a leakage of the light transmitted through the tile-shaped microelement 1 from the substrate 10 side.

Preferred examples of the insulating adhesive include ultraviolet curing resins such as acrylic resins, epoxy resins, melamine resins, polyimide resins, and the like, and heat curing resins. Also, a two-liquid mixing curing epoxy resin can be used as a chemical reaction curing type.

Although the adhesives including these resins have slight differences in light transmittance, they are substantially transparent, i.e., light-transmissive. Therefore, a black pigment or black dye, such as carbon black or the like, is added to the resin to decrease transmittance, thereby making the resin non-transmissive (light absorptive). The insulating performance decreases as the amount of the carbon black added increases. In this case, two layers including an adhesive layer containing carbon black and an adhesive layer not containing carbon black may be laminated by coating according to demand.

As shown in FIG. 1, the tile-shaped microelement 1 bonded to the substrate 10 is coated with the insulating functional film 12 together with the wirings 64 and 65. The functional film 12 is formed to have a function (property) according to the function of the semiconductor element in the tile-shaped microelement 1, and includes a resin film, an inorganic film, or a laminated film including these films.

In this exemplary embodiment, the functional film 12 is provided to cover and seal the entire tile-shaped microelement 1, and functions as a protective film. Namely, the functional film 12 has a barrier property against oxygen and moisture, and thus can prevent the progress of deterioration of the surface emitting laser in the tile-shaped microelement 1 due to oxygen and moisture.

As a material to form the functional film 12 having the barrier property against oxygen and moisture, the above-described resin material or inorganic material is used. Particularly, the resin material, such as an acrylic resin, an epoxy resin, a melamine resin, a polyimide resin, or the like is preferably used. Since the functional film 12 covers the light emission side of the surface emitting laser in the tile-shaped microelement 1, the functional film 12 is transmissive to visible light and infrared light. As described above, each of the above resins is transmissive to light and thus can be used for the transmissive functional film 12 of this exemplary embodiment without the addition of the black pigment or the like, unlike in the formation of the adhesive layer 11.

Various types of films can be used as the functional film 12 according to the function of the semiconductor element (semiconductor device) in the tile-shaped microelement 1, and various materials can also be used.

For example, the semiconductor element (semiconductor device) can be formed and used as various devices (not shown) other than the surface emitting laser, for example, a light emitting element (light emitting diode), a light receiving element (photodiode), a transistor, a diode, and the like. With respect to an operation state, for example, the light emitting element or light receiving element can be used in a state in which its light emitting section or light receiving section faces the substrate 10 side or the side opposite to the substrate 10, or faces in the planar direction of the substrate 10. In this case, the functional film 12 transmissive to visible light and infrared light is preferably used for the light emitting section or light receiving section of the light emitting element or light receiving element, and the side opposite to the light emitting section or light receiving section is preferably coated with a film non-transmissive to visible light and infrared light.

When the functional film 12 is provided for partial protection and insulation, the entire region of the tile-shaped microelement 1 is not coated, but only a principal portion, for example, the light emitting section or light receiving section of the light emitting element of light receiving element, may be coated, or only the wiring portion may be coated.

Besides the resin materials, oxides and nitride, such as SiOx, SiN, AlN, AlOx, ZrOx, ZnOx, TiOx, TaOx, $Y_2O_3$, and the like, and inorganic materials, such as diamond and the like, may be used for the functional film 12. Also, a laminated film of an inorganic material film and a resin material film may be used.

As the method of forming the resin film (the functional film 12), a droplet discharge process (ink jet process), a dispenser process, a spin coating process, a roll coating process, a printing process, or the like can be used. Particularly, when position selectivity is required, for example, when the resin film is selectively coated only on the light emitting section or light receiving section, the droplet discharge process or dispenser process is preferably used. The droplet discharge process or dispenser process is capable of providing the material for the functional film 12 only at a desired position, and thus the functional film 12 can be selectively provided only at a desired position of the substrate 10. Also, the amount of the material used for the functional film 12 can be significantly decreased, thereby decreasing the manufacture cost.

When the functional film 12 includes an inorganic film or diamond film, the functional film 12 can be caused to function as a heat radiating layer. Namely, during driving, heat is generated from the semiconductor element in the tile-shaped microelement 1 to increase the element temperature to deteriorate the element properties. However, the functional film 12 can radiate heat to reduce or prevent the deterioration in the element properties.

As the method of forming the inorganic film (the functional film 12), a vacuum deposition method, a CVD method, or a method including forming a film of a precursor (for example, polysilazane when a $SiO_2$ film is formed) of a material to form the film, and then oxidizing (heating) or nitriding the film to form a desired film can be used.

The functional film 12 may include a laminate of inorganic material films, a laminate of resin material films, or a laminate of an inorganic material film and resin material film. In this case, the functions of the respective films are combined to form a film having multiple functions.

For example, inorganic material films having different refractive indexes may be laminated, or an inorganic material film and resin material film may be laminated to form the functional film 12 functioning as an anti-reflection film.

Consideration is given to the simplest case in which the single-layer antireflection film is formed on a GaAs (refractive index n=3.6) surface. When a film with a refractive index n is formed to a thickness d=$\lambda$/4n, the lowest reflectance can be obtained at wavelength $\lambda$. The reflectance becomes minimum when the refractive index n of the film is close to the square root 1.89 of the refractive index of 3.6 of GaAs.

Therefore, when yttrium oxide ($Y_2O_3$; refractive index n=1.87) is used as the material of the film, and the thickness d is 113.6 nm, the calculated reflectance at $\lambda$=850 nm is 0.5%. Therefore, the film is found to be the good anti-reflection film.

When zirconia ($ZrO_2$; refractive index n=2.0) is used as the material of the film, and the thickness d is 106.25 nm, the calculated reflectance at $\lambda$=850 nm is 2%. Therefore, the film is also found to sufficiently function as the anti-reflection film.

Also, a metal film may be laminated on the resin material film or inorganic material film to make the transmissive film non-transmissive and enhance the barrier property against oxygen and moisture.

Besides the silicon semiconductor substrate, a substrate including quartz glass, sapphire, a metal, a ceramic or plastic film may be used as the substrate 10. When the substrate 10 includes a silicon semiconductor, the substrate 10 may be used for CCD (charge coupled device). When the substrate 10 includes glass, such as quartz or the like, the substrate 10 can be used for a display, such as a liquid crystal display (LCD), an organic EL device, or the like. When the substrate 10 includes a plastic film, the substrate 10 can be used for a liquid crystal display, an organic electroluminescence panel, an IC film package or the like.

Furthermore, a plurality of the tile-shaped microelements 1 may be provided on the substrate 10. In this case, one of the tile-shaped microelements 1 preferably includes a device having a function different from the functions of the other tile-shaped microelements 1.

Examples of a combination of the tile-shaped microelements 1 include the following:

(1) One of the tile-shaped microelement 1 includes a light emitting clement, and the other tile-shaped microelements 1 include light receiving elements.

(2) One of the tile-shaped microelement 1 includes a light emitting element emitting light at a wavelength $\lambda_1$, and the other tile-shaped microelements 1 include light emitting elements emitting light at a wavelength $\lambda_2$.

(3) One of the tile-shaped microelement 1 includes a light receiving element detecting light at a wavelength $\lambda_1$, and the other tile-shaped microelements 1 include light receiving elements detecting light at a wavelength $\lambda_2$.

(4) One of the tile-shaped microelement 1 includes a transistor, and the other tile-shaped microelements 1 include diodes.

Herein, examples of the light emitting element include the above-described gallium arsenide surface emitting laser (VCSEL), a photodiode (PD), and the like. Examples of the transistor include a high electron mobility transistor (HEMT), and the like. The semiconductor element (semiconductor device) provided in the tile-shaped microelement 1 may include a resistor or capacitor, or only the resistor or capacitor may be formed as the semiconductor device.

Second Exemplary Embodiment

Figure 4:
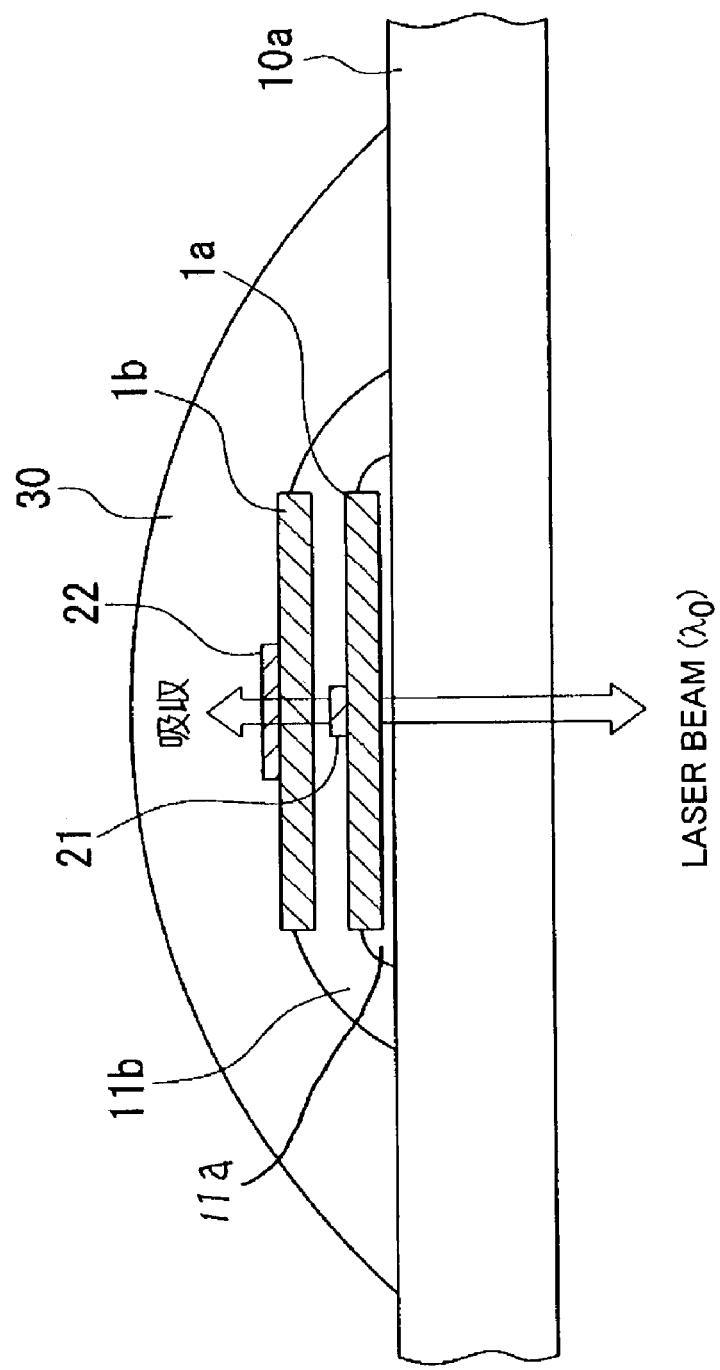
FIG. 4 is a sectional side view illustrating a significant portion of the schematic construction of a semiconductor device according to another exemplary embodiment of the present invention.

FIG. 4 is a schematic showing a semiconductor device according to a second exemplary embodiment of the present invention. Particularly, the semiconductor device includes two types of tile-shaped microelements 1 which are superposed.

Namely, the semiconductor device shown in FIG. 4 includes a tile-shaped microelement 1a including a surface emitting laser 21 and a tile-shaped microelement 1b including a photodiode 22, both of which are provided on a transparent substrate 10a, and a functional film 30 covering these elements.

Each of adhesive layers 11a and 11b for respectively bonding the tile-shaped microelement 1a and the tile-shaped microelement 1b to the substrate 10a has transparency and insulation performance. The adhesive layer 11b to bond together the tile-shaped microelement 1a and the tile-shaped microelement 1b also serves as a functional film to cover and protect the tile-shaped microelement 1a. The functional film 30 comprises a non-transmissive material, i.e., the above-described resin material containing a black pigment, such as carbon black or the like.

In this exemplary embodiment, the surface emitting laser 21 of the tile-shaped microelement 1 emits a laser beam (wavelength $\lambda_0$) toward the substrate 10a, and also emits a laser beam (wavelength $\lambda_0$) toward the tile-shaped microelement 1b. The photodiode 22 of the tile-shaped microelement 1b is disposed on the emission axis of the surface emitting laser 21. Therefore, the laser beam (wavelength $\lambda_0$) emitted to the tile-shaped microelement 1b is incident on the photodiode 22 so that the output (emission amount) of the laser beam (wavelength $\lambda_0$) emitted from the surface emitting laser 21 is detected by the photodiode 22.

On the other hand, the laser beam (wavelength $\lambda_0$) emitted to the substrate 10a is transmitted through the transparent substrate 10a and is used as a communication signal or the like.

The laser beam (wavelength $\lambda_0$) emitted from the surface emitting laser 21 of the tile-shaped microelement 1 and incident on the photodiode 22 of the tile-shaped microelement 1b is transmitted through the tile-shaped microelement 1b and absorbed by the non-transmissive functional film 30, thereby reducing or preventing a leakage to the outside. Therefore, stray light due to the laser beam transmitted through the tile-shaped microelement 1b can be significantly decreased, and noise due to feedback light can be decreased.

Figure 5:
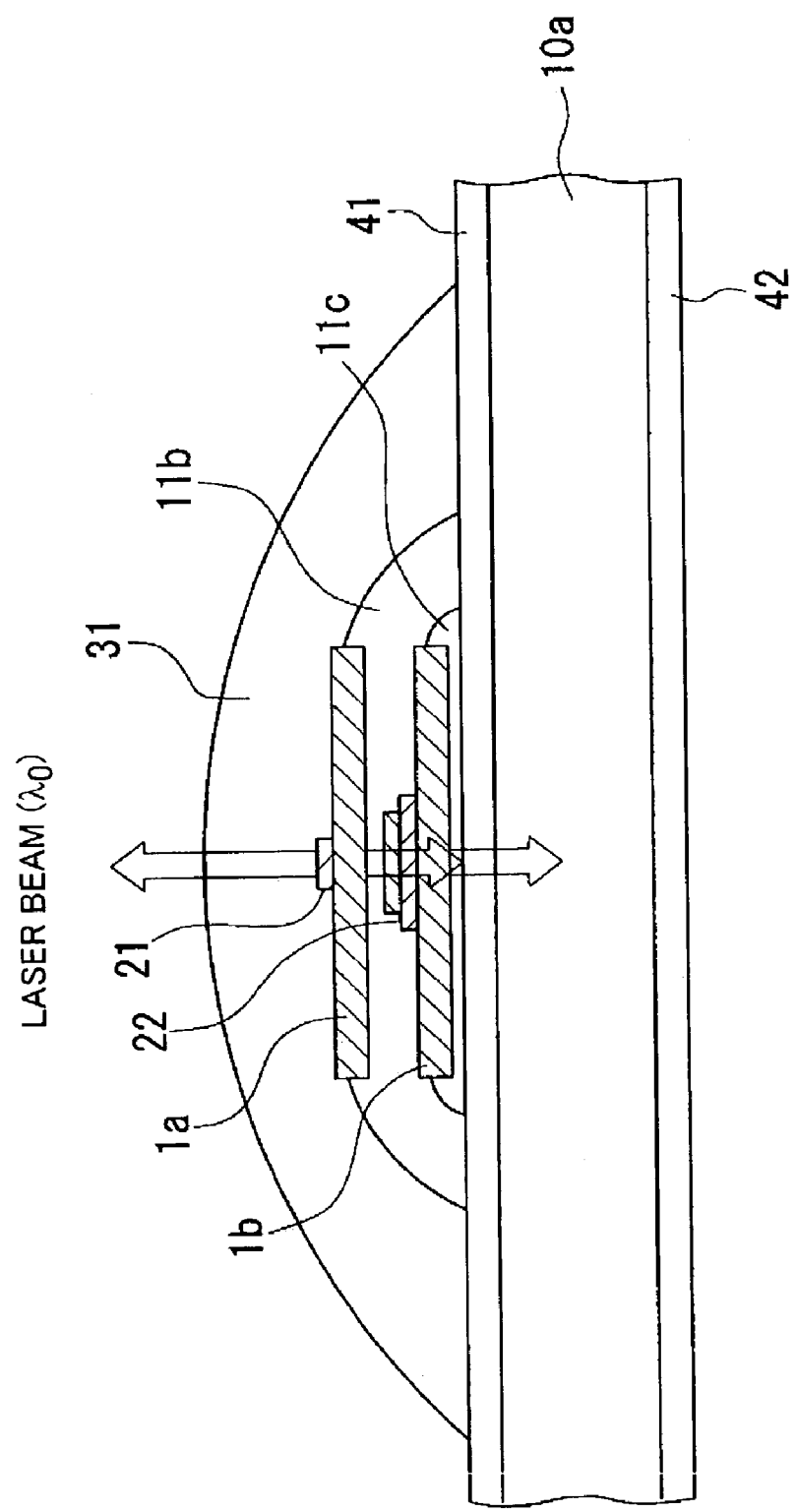
FIG. 5 is a sectional side view illustrating a significant portion of the schematic construction of a semiconductor device according to a modified exemplary embodiment of the semiconductor device shown in FIG. 4.

FIG. 5 shows a modified exemplary embodiment of the semiconductor device shown in FIG. 4. The semiconductor device shown in FIG. 5 is different from the semiconductor device shown in FIG. 4 in that the positions of the tile-shaped microelements 1a and 1b are reversed vertically, in that each of the surface emitting laser 21 and the photodiode 22 provided on the tile-shaped microelements 1a and 1b, respectively, faces the side opposite to that in FIG. 4, in that the upper surface of the tile-shaped microelement 1a including the surface emitting laser 21 is covered with a transmissive functional film 31, in that the tile-shaped microelement 1b is bonded to the substrate 10a with an adhesive layer 11c comprising a non-transmissive adhesive, and in that anti-reflection layers 41 and 42 are provided at the top and bottom of the substrate 10a. When the substrate 10a includes a non-transparent member, the anti-reflection layer need not be provided at the bottom of the substrate 10a. Instead of the anti-reflection layer 42 provided at the bottom of the substrate 10a, a light absorbing layer may be provided at the bottom of the substrate 10a. The functional film 31 includes a light-transmissive material, i.e., the above-described light-transmissive resin material or inorganic material.

Therefore, in the semiconductor device of this exemplary embodiment, a laser beam (wavelength $\lambda_0$) is emitted upward (upward in the drawing) apart from the substrate 10a in the direction opposite to that in the semiconductor device shown in FIG. 4. Like in the semiconductor device shown in FIG. 4, stray light due to a laser beam transmitted through the tile-shaped microelement 1b can be significantly decreased, and noise due to feedback light can be decreased.

(Exemplary Method of Manufacturing the Tile-Shaped Microelement)

A description is provided below of the method of manufacturing the tile-shaped microelement and the semiconductor device.

In the manufacturing method, a description is provided of a case in which a compound semiconductor device (compound semiconductor element) formed as the tile-shaped microelement is bonded to a silicon LSI chip used as a substrate. However, the present invention can be applied to any type of semiconductor device and any type of LSI chip. In this exemplary embodiment, the "semiconductor substrate" means a substrate including a semiconductor material. However, the "semiconductor substrate" is not limited to a plate-shaped substrate, and includes any substrate including a semiconductor material regardless of the shape.

<First Step>

Figure 6:
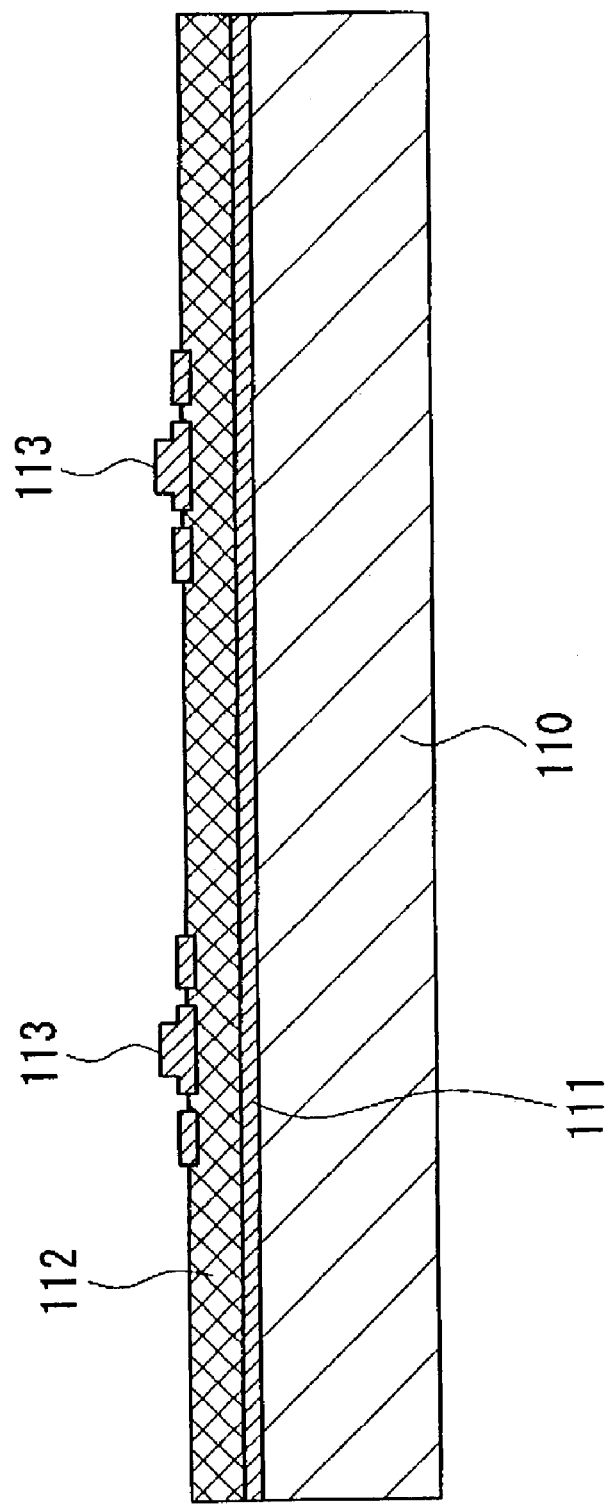
FIG. 6 is a sectional side view illustrating a significant portion in a first step of an example of a method of manufacturing a semiconductor device according to the present invention.

FIG. 6 is a schematic sectional view showing the first step of the manufacturing method. In FIG. 6, a substrate 110 is a semiconductor substrate, for example, a gallium arsenide compound semiconductor substrate. A sacrificial layer 111 is provided as a bottom layer on the substrate 110. The sacrificial layer 111 includes aluminum arsenide (AlAs) and has a thickness of, for example, several hundreds nm.

For example, a functional layer 112 is provided on the sacrificial layer 111. The thickness of the functional layer 112 is, for example, about 1 μm to 10 (20) μm. Furthermore, semiconductor devices (semiconductor elements) 113 are formed on the functional layer 112. As the semiconductor devices 113, for example, light emitting diodes (LED), surface emitting lasers (VCSEL), photodiodes (PD), high electron mobility transistors (HEMT), hetero bipolar transistors (HBT), or the like can be formed. Any one of these semiconductor devices 113 is formed by laminating a plurality of epitaxial layers on the substrate 110. Each of the semiconductor devices 113 further comprises an electrode, and is subjected to an operating test.

<Second Step>

Figure 7:
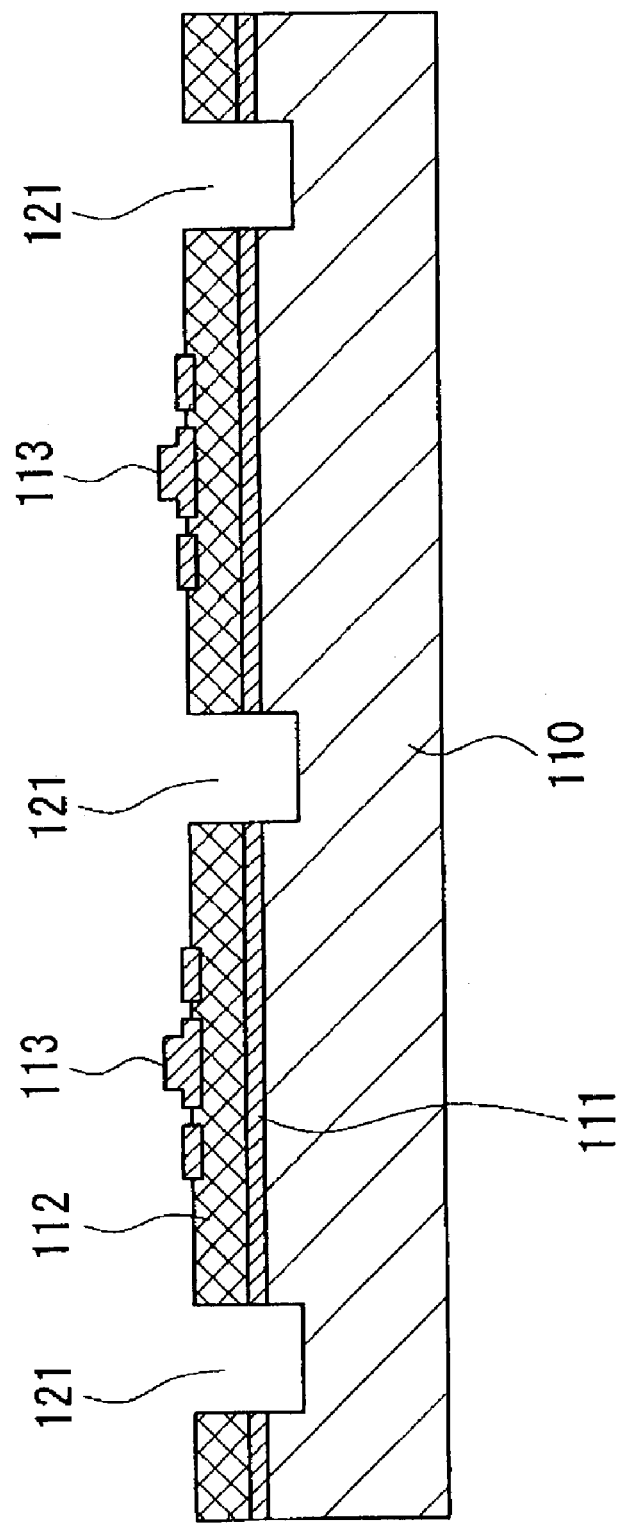
FIG. 7 is a sectional side view illustrating a significant portion in a second step of the example of the manufacturing method.

FIG. 7 is a schematic sectional view showing the second step of the manufacturing method. In this step, separation grooves 121 are formed to separate the respective semiconductor devices 113. The separation grooves 112 have a depth reaching at least the sacrificial layer 111. For example, the width and depth of the separation grooves 121 are 10 μm to several hundreds μm. The separation grooves 121 are connected to each other without dead ends so that the selective etching solution described below flows through the separation grooves 121. Furthermore, the separation grooves 121 are preferably formed in a grid-like shape.

The interval of the separation grooves 121 is several tens μm to several hundreds μm, and thus the size of each of the semiconductor devices 113 separated by the separation grooves 121 has an area of several tens μm to several hundreds μm square. The separation grooves 121 are formed by a method including photolithography and wet etching, or a dry etching method. The separation grooves 121 may be formed in U-shaped grooves by dicing in a range causing no crack in the substrate.

<Third Step>

Figure 8:
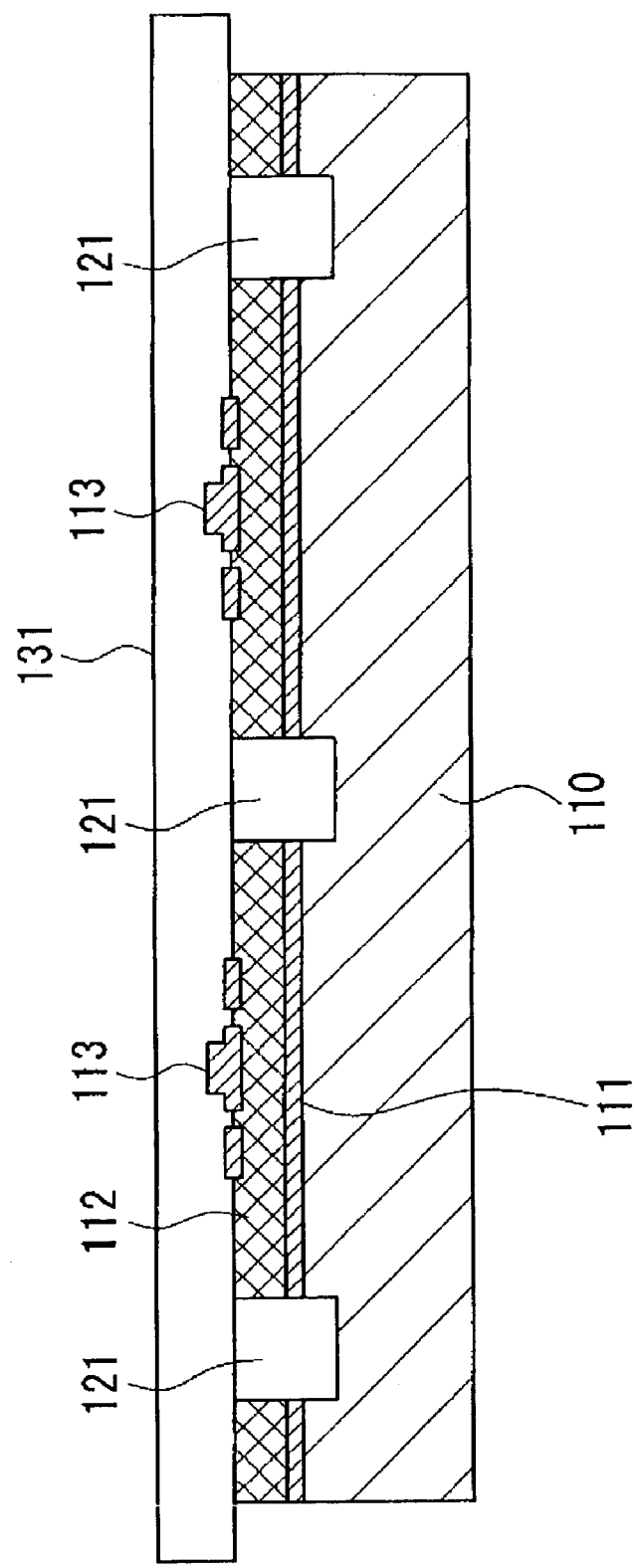
FIG. 8 is a sectional side view illustrating a significant portion in a third step of the example of the manufacturing method.

FIG. 8 is a schematic sectional view showing the third step of the manufacturing method. In this step, an intermediate transfer film 131 is bonded to the surface (the semiconductor device 113 side) of the substrate 110. The intermediate transfer film 131 is a flexible strip-shaped film having a surface coated with an adhesive.

<Fourth Step>

Figure 9:
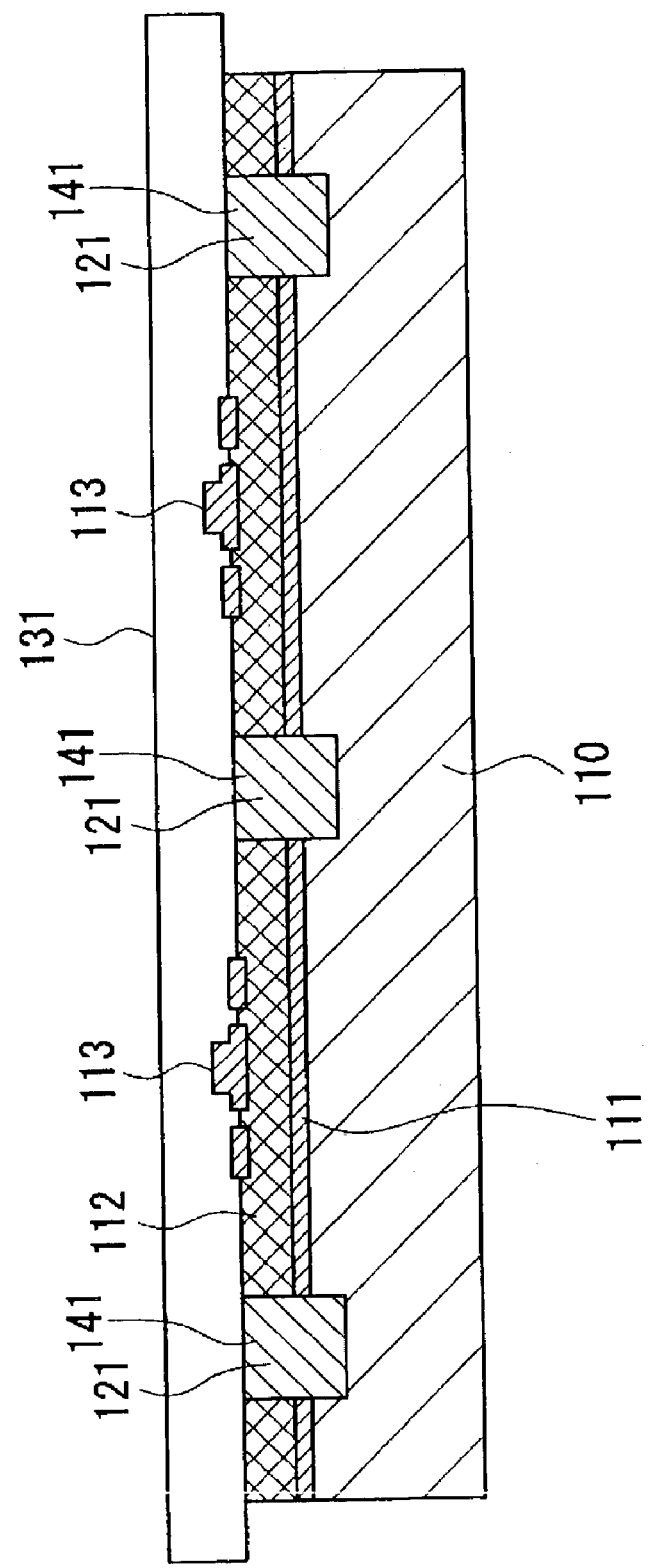
FIG. 9 is a sectional side view illustrating a significant portion in a fourth step of the example of the manufacturing method.

FIG. 9 is a schematic sectional view showing the fourth step of the manufacturing method. In this step, a selective etching solution 141 is injected into the separation grooves 121. In this step, low concentration hydrochloric acid having high selectivity to aluminum arsenide is used as the selective etching solution 141 to selectively etch only the sacrificial layer 111.

<Fifth Step>

Figure 10:
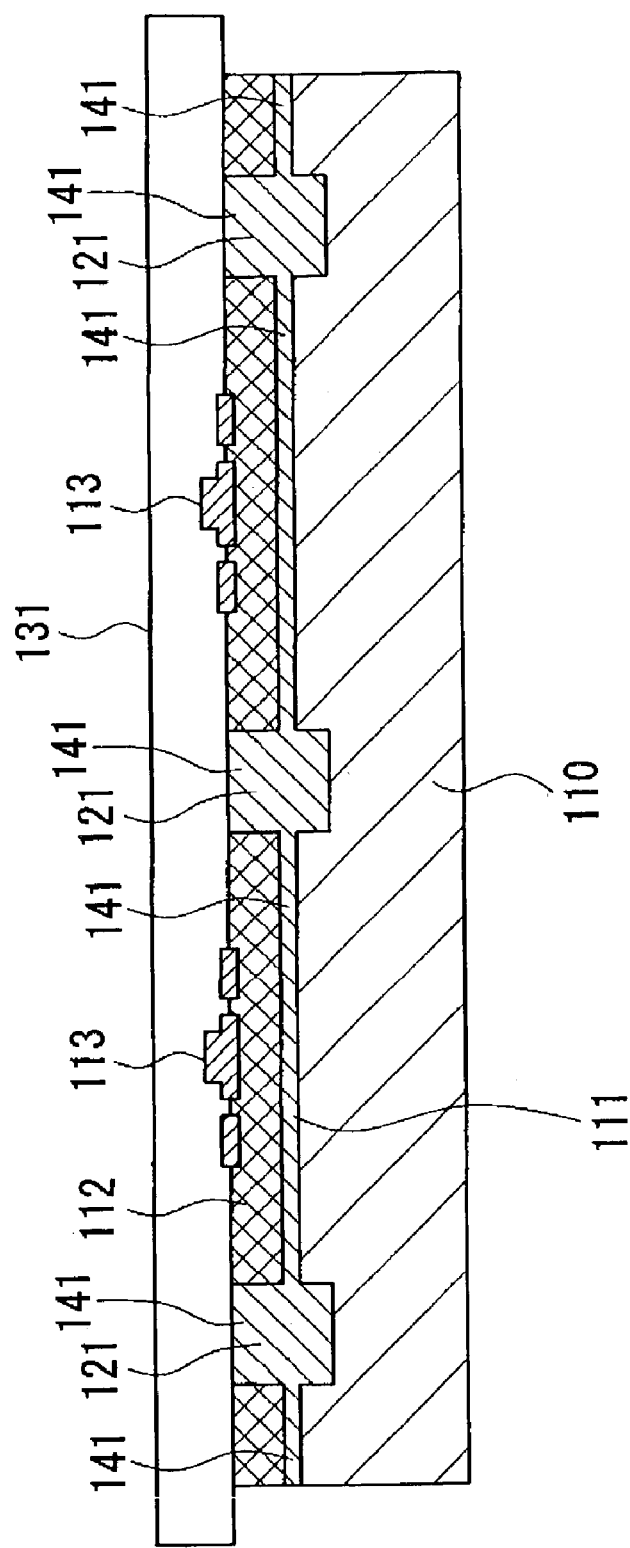
FIG. 10 is a sectional side view illustrating a significant portion in a fifth step of the example of the manufacturing method.

FIG. 10 is a schematic sectional view showing the fifth step of the manufacturing method. In this step, the sacrificial layer 111 is entirely removed by selective etching after the passage of a predetermined time from the injection of the selective etching solution 141 into the separation grooves 121 in the fourth step.

<Sixth Step>

Figure 11:
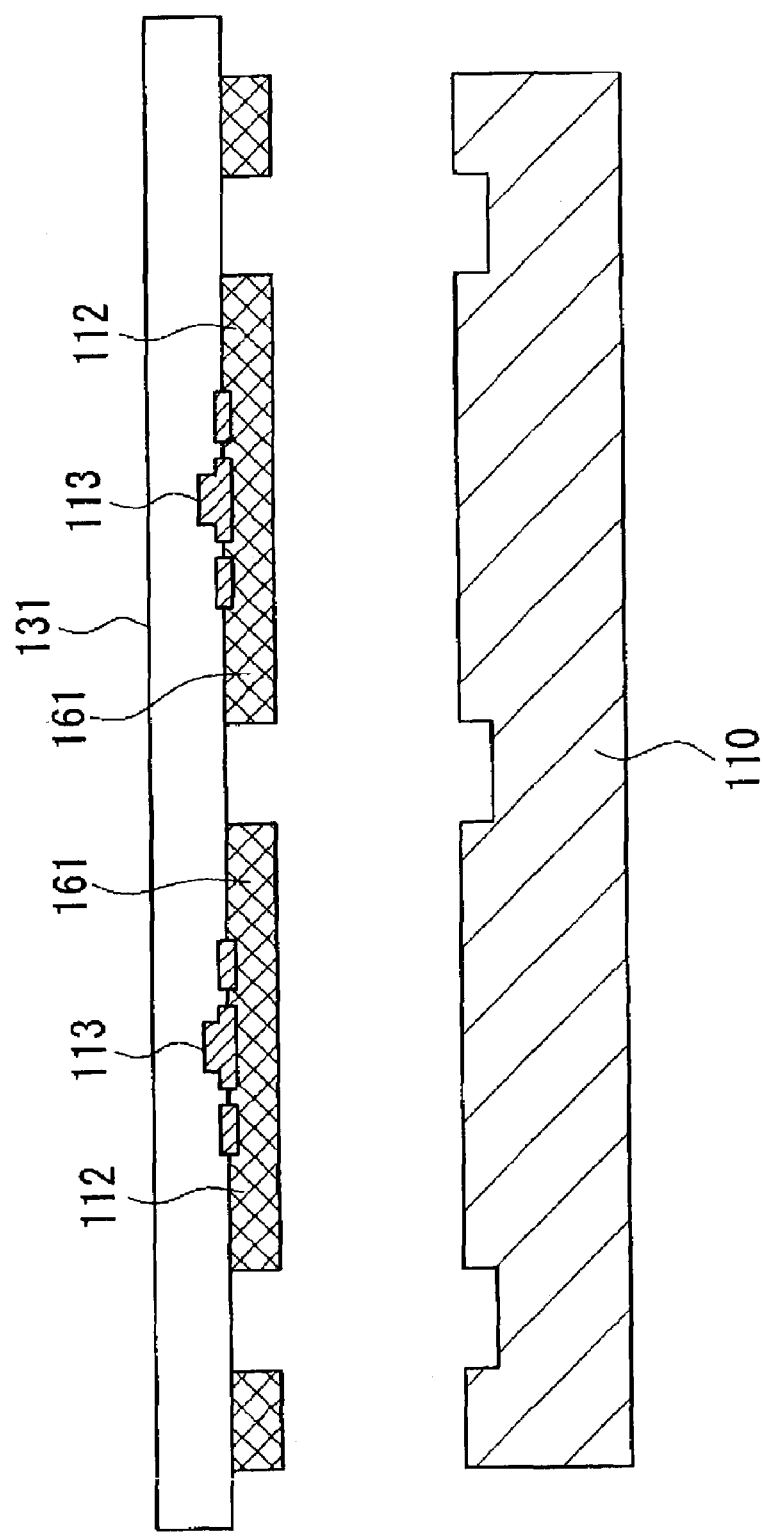
FIG. 11 is a sectional side view illustrating a significant portion in a sixth step of the example of the manufacturing method.

FIG. 11 is a schematic sectional view showing the sixth step of the manufacturing method. After the sacrificial layer 111 is entirely etched out in the fifth step, the functional layer 112 is separated from the substrate 110.

In the sixth step, the intermediate transfer film 131 is separated from the substrate 110 to separate the functional film 112 bonded to the intermediate transfer film 131 from the substrate 110.

As a result, the functional film 112 having the semiconductor devices 113' formed thereon is divided into predetermined shapes (for example, micro tile shapes) by the separation grooves 121 and etching of the sacrificial layer 111 to form semiconductor elements (the "tile-shaped microelements" of each of the above embodiments), the functional film 112 being adhered to the intermediate transfer film 131. In this step, the thickness of the functional layer 112 is preferably, for example, 1 μm to 8 μm, and the size (width and length) is preferably, for example, several tens μm to several hundreds μm.

<Seventh Step>

Figure 12:
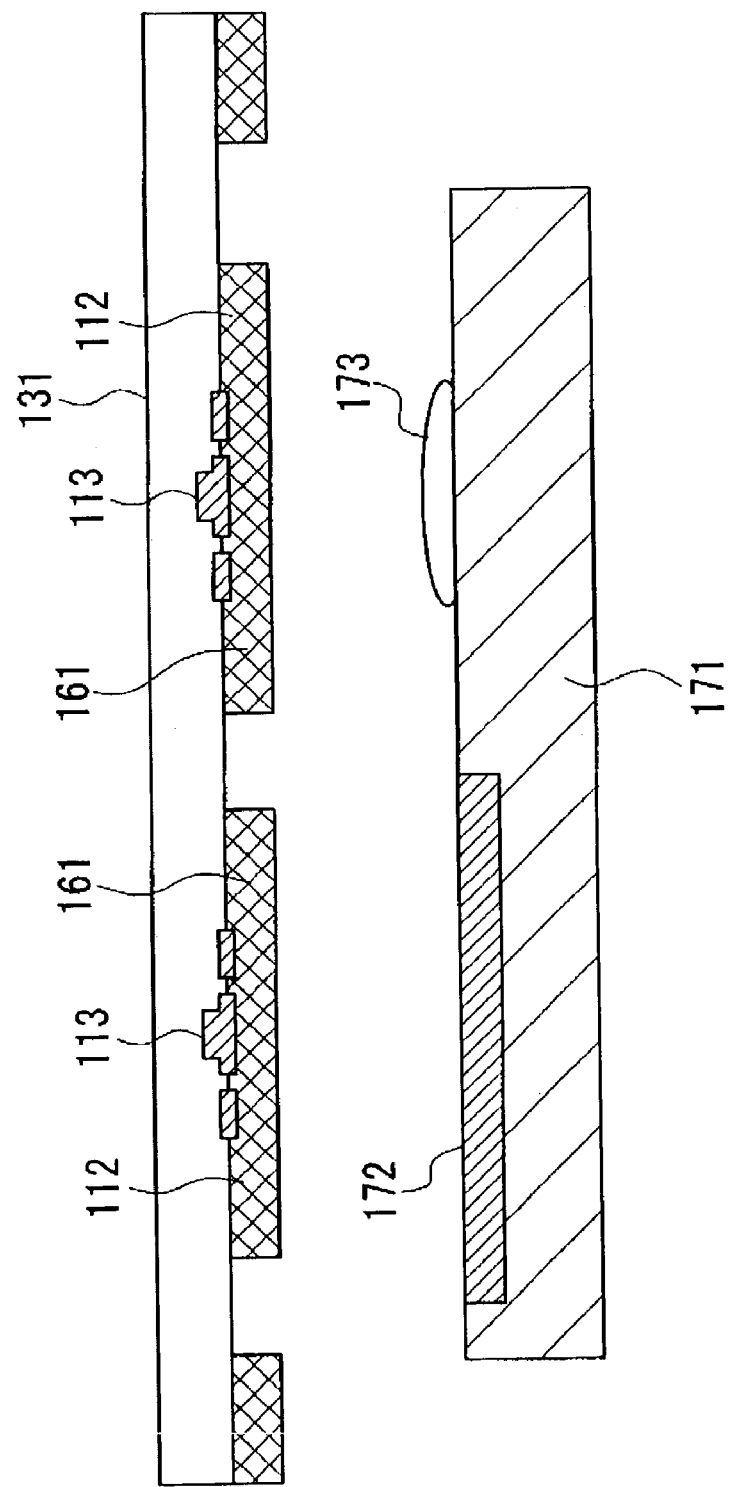
FIG. 12 is a sectional side view illustrating a significant portion in a seventh step of the example of the manufacturing method.

FIG. 12 is a schematic sectional view showing the seventh step of the manufacturing method. In this step, the intermediate transfer film 131 having the tile-shaped microelements 161 bonded thereto is moved to align each of the tile-shaped microelements 161 with a desired position of a final substrate 171 (the substrate 10 or 10a). The final substrate 171 includes, for example, a silicon semiconductor, and a LSI region 172 is formed on the final substrate 171. Also, an adhesive 173 is coated on the desired position of the final substrate 171, to bond the tile-shaped microelement 161.

<Eighth Step>

Figure 13:
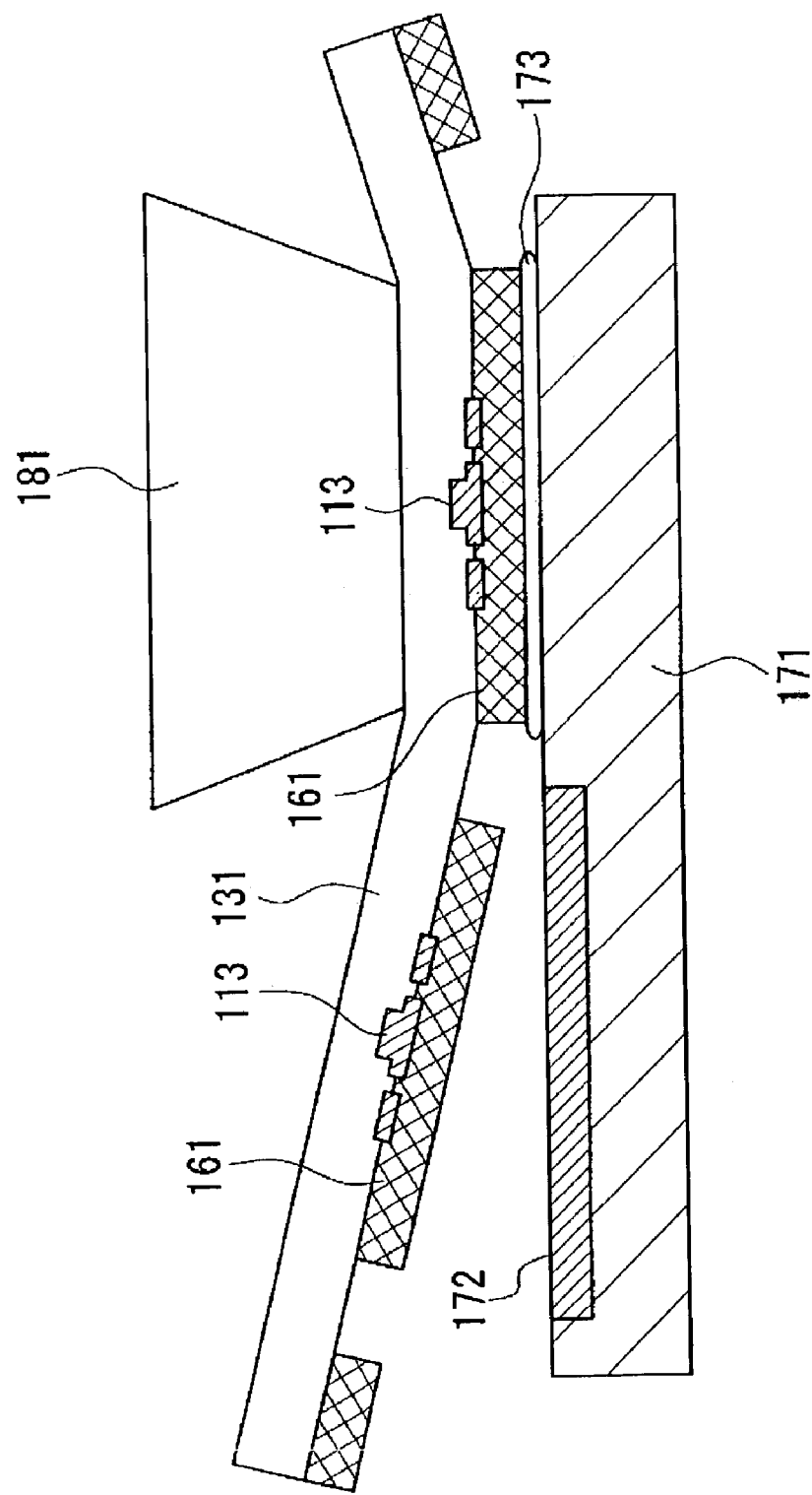
FIG. 13 is a sectional side view illustrating a significant portion in an eighth step of the example of the manufacturing method.

FIG. 13 is a schematic sectional view showing the eighth step of the manufacturing method. In this step, the tile-shaped microelement 161 aligned with the desired position of the final substrate 171 is pressed by a collet 181 with the intermediate transfer film 131 provided therebetween, and is joined to the final substrate 171. Since the desired position is coated with the adhesive 173, the tile-shaped microelement 161 is bonded to the desired position of the final substrate 171.

<Ninth Step>

Figure 14:
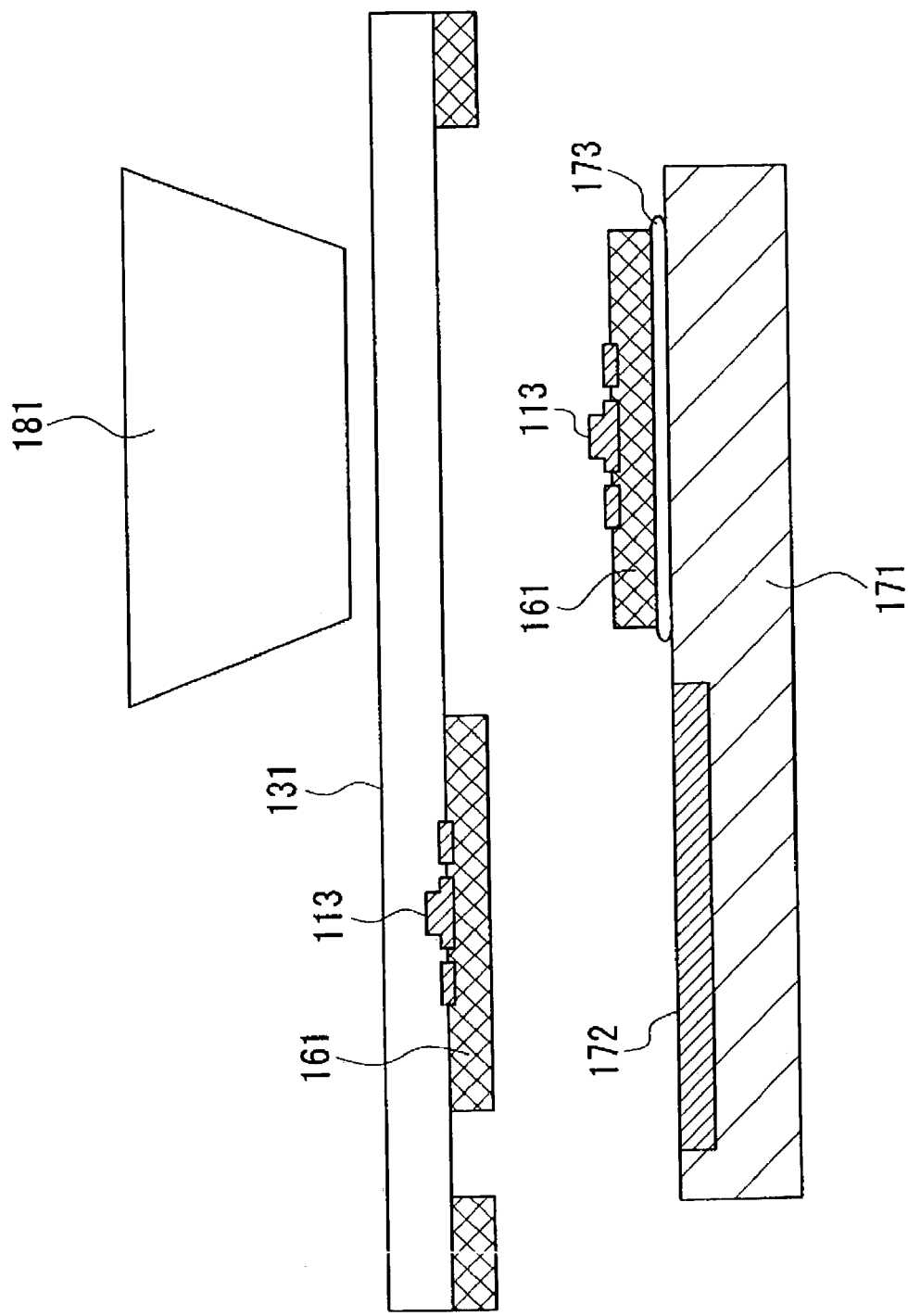
FIG. 14 is a sectional side view illustrating a significant portion in a ninth step of the example of the manufacturing method.

FIG. 14 is a schematic sectional view showing the ninth step of the manufacturing method. In this step, the adhesive force of the intermediate transfer film 131 is lost to separate the intermediate transfer film 131 from the tile-shaped microelement 161.

The adhesive of the intermediate transfer film 131 is preferably UV curable or heat curable. With the UV curable adhesive, the collet 181 including a transparent material is used, and an ultraviolet ray (UV) is applied to the end of the collet 181 to lose the adhesive force of the intermediate transfer film 131. With the heat curable adhesive, the collet 181 may be heated. Alternatively, the entire surface of the intermediate transfer film 131 may be irradiated with an ultraviolet ray to lose the adhesive force of the entire surface after the sixth step. Although the adhesive force is lost, adhesion actually slightly remains so that the tile-shaped microelement 161 is held on the intermediate transfer film 131 because the tile-shaped microelement 161 is thin and lightweight.

<Tenth Step>

This step is not shown in a drawing. In this step, the tile-shaped microelement 161 is finally bonded to the final substrate 171 by heating or the like.

<Eleventh Step>

Figure 15:
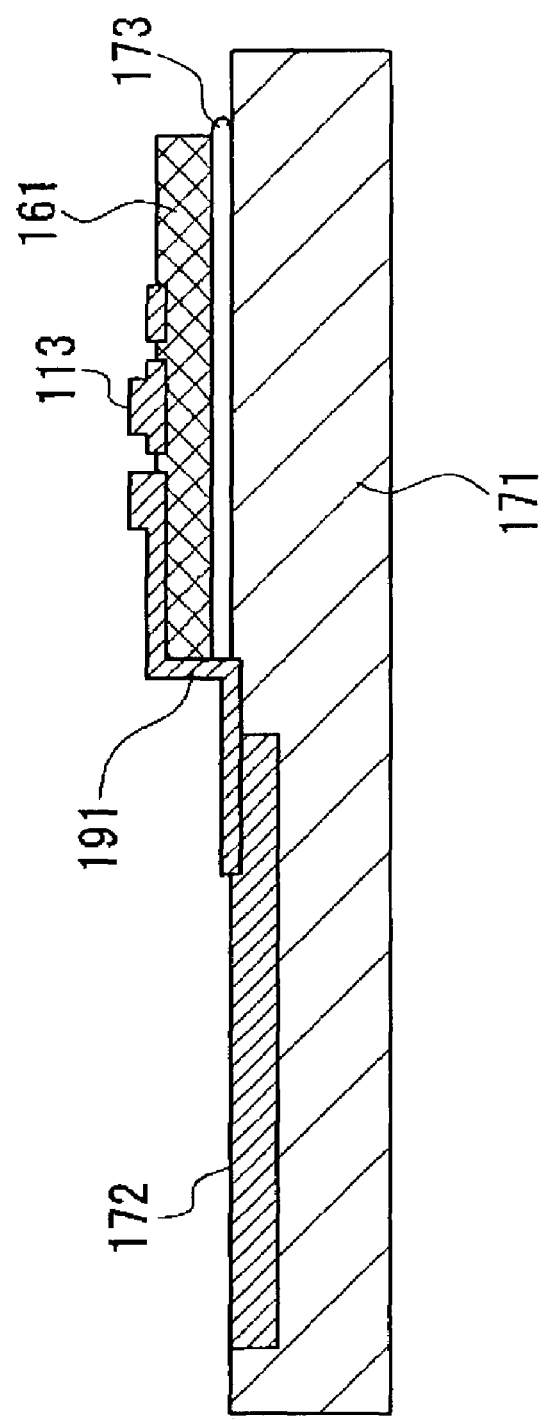
FIG. 15 is a sectional side view illustrating a significant portion in an eleventh step of the example of the manufacturing method.

FIG. 15 is a schematic sectional view showing the eleventh step of the manufacturing method. In this step, the electrode of the tile-shaped microelement 161 is electrically connected to the circuit 172 formed on the final substrate 171 through wiring 191 to complete a semiconductor device, such as an LSI chip. As the final substrate 171, a glass quartz substrate or plastic film as well as the silicon semiconductor may be used.

<Twelfth Step>

In this step, a resin material or inorganic material film is formed on the tile-shaped microelement 161 formed on the final substrate 171 in the step shown in FIG. 15 to form a functional film covering at least a portion of the tile-shaped microelement 161, as shown in FIG. 1. The properties and shape of the functional film are appropriately selected according to the semiconductor element (semiconductor device) provided in the tile-shaped microelement 161.

When the tile-shaped microelements are superposed, the steps from the first step to the twelfth step are repeated. By performing these steps, a plurality of tile-shaped microelements can be simply and rapidly superposed on a predetermined substrate.

(Application)

Examples of application of the semiconductor device of the present invention are described below.

In a first example of application, the semiconductor device of the second exemplary embodiment is used as an optoelectronics integrated circuit. Namely, like in the second exemplary embodiment, a light emitting element (surface emitting laser) and a light receiving element (photodiode) are superposed, and an APC circuit is also provided to form an integrated circuit comprising an optical output device. A plurality of light emitting elements having different emission wavelengths may be superposed to form an integrated circuit including an emission means (output device). Alternatively, a plurality of light receiving elements selectively detecting lights at different wavelengths may be superposed to form an integrated circuit including a receiving device (input device).

By using any of these integrated circuits, for example, a computer is formed. Although an electric signal is used for signal processing in the integrated circuit constituting a CPU, an optical input/output device is used in a bus to transmit data between the CPU and a storage device.

In this example of application, the signal transfer speed of the bus, which is a bottleneck of the processing speed of the computer, can be significantly increased, as compared with a related art computer.

In this example of application, the tile-shaped microelements are superposed, and thus the computer can be significantly miniaturized.

In this example of application, when a surface emitting laser with an APC circuit is used for the input/output device constituting the bus, a high-performance state can be stably maintained over a long period of time.

In a second example of application, instead of a thin film transistor (TFT) generally used as a driving transistor, a resistor, a capacitor or the like, a silicon transistor, a resistor or a capacitor formed in the tile-shaped microelement is used for each pixel of an electro-optic device, such as a liquid crystal display, a plasma display or an organic EL (Electroluminescence) display to form a semiconductor device.

In this example of application, a high-performance switching function can be achieved as compared with the use of the TFT, and an electro-optic device capable of changing display states at a high speed can be provided.

(Exemplary Electronic Apparatus)

Examples of an electronic apparatus including the semiconductor device and electro-optic device of any one of the exemplary embodiments are described below.

Figure 16:
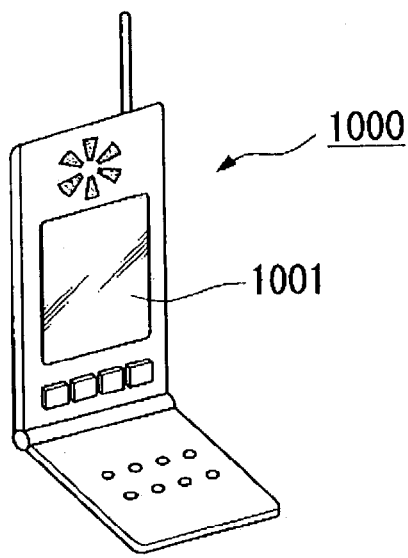
FIG. 16 is a schematic showing an example in which an electronic apparatus including an electro-optic device of the present invention is applied to a cellular phone.

FIG. 16 is a perspective view showing an example of a cellular phone. In FIG. 16, reference numeral 1000 denotes a cellular phone body including the semiconductor device, and reference numeral 1001 denotes a display section comprising the electro-optic device.

Figure 17:
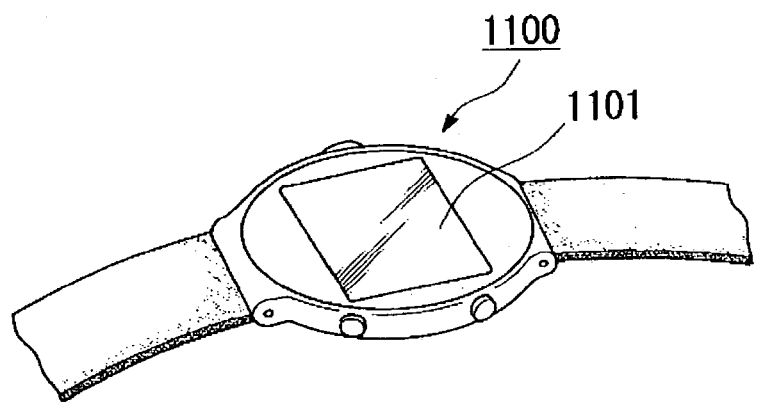
FIG. 17 is a schematic showing an example in which an electronic apparatus including an electro-optic device of the present invention is applied to a wristwatch-type electronic apparatus.

FIG. 17 is a perspective view showing an example of a wristwatch-type-electronic apparatus. In FIG. 17, reference numeral 1100 denotes a watch body including the semiconductor device, and reference numeral 1101 denotes a display section including the electro-optic device.

Figure 18:
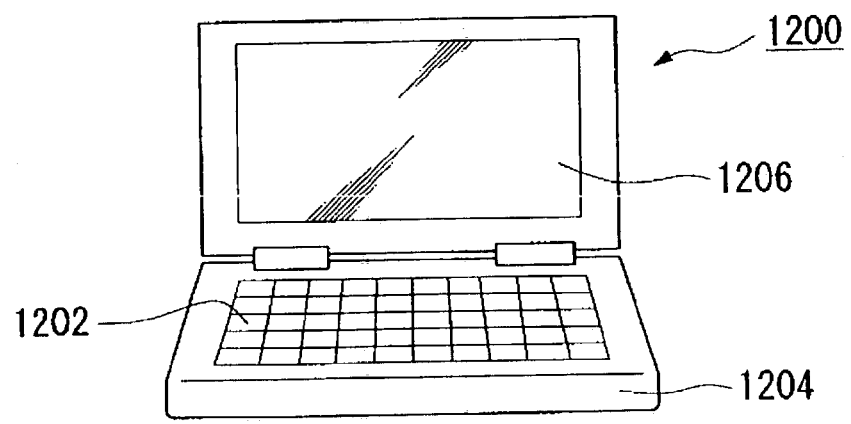
FIG. 18 is a schematic showing an example in which an electronic apparatus including an electro-optic device of the present invention is applied to a portable information processor.

FIG. 18 is a perspective view showing an example of portable information processors, such as a word processor, a personal computer, and the like. In FIG. 18, reference numeral 1200 denotes an information processor, reference numeral 1202 denotes an input section such as a key board or the like, reference numeral 1204 denotes an information processor body including the semiconductor device, and reference numeral 1206 denotes a display section including the electro-optic device.

Each of the electronic apparatuses shown in FIGS. 16 to 18 includes the semiconductor device and the electro-optic device of any one of the exemplary embodiments, and thus an electronic apparatus including a display section having high display quality, particularly a bright screen with high responsiveness, can be realized. By using the semiconductor device of any of the exemplary embodiments, an electronic apparatus can be miniaturized as compared with a related art apparatus. Furthermore, by using the semiconductor device of any of the exemplary embodiments, the manufacturing cost can be decreased as compared with a related art apparatus.

The present invention is not limited to the above-described exemplary embodiments, and various changes can be made within the scope of the gist of the present invention. For example, the materials and layer structures of the above embodiments are only examples, and a proper change can be made.

In the exemplary embodiments, a semiconductor device includes a plurality of superposed tile-shaped microelements having different functions. However, the present invention is not limited to the exemplary embodiments, and the tile-shaped microelements may be separately disposed on a substrate.

[Advantages]

As described above, in the present invention, an insulating functional film is provided to cover at least a portion of a tile-shaped microelement. Therefore, for example, when the functional film is given a barrier property against oxygen and moisture, deterioration in the element function can be reduced or suppressed to increase the lifetime of the element, thereby enhancing reliability.

What is claimed is:

1. A semiconductor device, comprising:
   a substrate;
   a tile-shaped microelement bonded to the substrate through an adhesive, wherein the tile-shaped microelement has a lower mirror, an active layer over the lower mirror, an upper mirror over the active layer, and a current aperture; and
   an insulating protective film having a barrier property against oxygen and moisture, the insulating protective film provided to seal the adhesive, the lower mirror, the active layer and the upper mirror and the insulating protective film contacting the substrate.

2. The semiconductor device according to claim 1, the current aperture having ring shape.

3. The semiconductor device according to claim 2, the current aperture being a first portion made of a semiconducting material, and the first portion being surrounded by a second portion made of an insulating material.

4. The semiconductor device according to claim 3, the insulating material being an oxide layer.

5. A semiconductor device, comprising:
   a substrate;
   a surface emitting laser bonded to the substrate through an adhesive, the surface emitting laser having a first mirror, an active layer over the first mirror, a second mirror over the active layer, and a current aperture; and
   an insulating protective film having a barrier property against oxygen and moisture, the insulating protective film provided to seal the adhesive, the first mirror, the active layer and the second mirror and the insulating protective film contacting the substrate.

6. The semiconductor device according to claim 5, the current aperture having ring shape.

7. The semiconductor device according to claim 5, the current aperture being formed by an insulating material.

8. The semiconductor device according to claim 5, the current aperture being a first portion made of a semiconducting material, and the first portion being surrounded by a second portion made of an insulating material.

9. The semiconductor device according to claim 8, the insulating material being an oxide layer.

10. The semiconductor device according to claim 5, the surface emitting laser including a highly conductive layer.

11. The semiconductor device according to claim 9, the highly conductive layer being disposed between the substrate and the first mirror.

12. The semiconductor device according to claim 5, the surface emitting laser including a first electrode being formed on the first mirror and a second electrode being formed on the second mirror through a contact layer.

13. The semiconductor device according to claim 5, the substrate being light-transmissive, and the surface emitting laser being bonded to the substrate with an adhesive transmissive to a visible light and an infrared light.

14. The semiconductor device according to claim 5, the surface emitting laser being bonded to the substrate with an adhesive which is non-transmissive to at least one of a visible light and an infrared light.

* * * * *